United States Patent
Eguchi et al.

(10) Patent No.: US 10,121,519 B2
(45) Date of Patent: Nov. 6, 2018

(54) SEMICONDUCTOR DEVICE AND CONTROL METHOD THEREOF

(71) Applicant: Toshiba Memory Corporation, Tokyo (JP)

(72) Inventors: Toyokazu Eguchi, Inagi Tokyo (JP); Hajime Matsumoto, Higashimurayama Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,842

(22) Filed: Sep. 3, 2017

(65) Prior Publication Data

US 2018/0286465 A1 Oct. 4, 2018

(30) Foreign Application Priority Data

Mar. 29, 2017 (JP) .................................. 2017-065616

(51) Int. Cl.
*G11C 5/14* (2006.01)
*G11C 11/4074* (2006.01)
*G05F 1/59* (2006.01)
*G11C 7/10* (2006.01)

(52) U.S. Cl.
CPC .................. *G11C 5/14* (2013.01); *G05F 1/59* (2013.01); *G11C 5/147* (2013.01); *G11C 7/1051* (2013.01); *G11C 7/1096* (2013.01); *G11C 11/4074* (2013.01)

(58) Field of Classification Search
CPC ........ G11C 5/14; G11C 7/1051; G11C 7/1096

USPC .......................................................... 365/226
See application file for complete search history.

(56) References Cited

U.S. PATENT DOCUMENTS

| | | | |
|---|---|---|---|
| 8,259,422 B2 | 9/2012 | Naito et al. | |
| 9,312,835 B2 | 4/2016 | Shieh et al. | |
| 9,331,568 B2 | 5/2016 | Shieh et al. | |
| 9,443,601 B2 | 9/2016 | Lucas et al. | |
| 9,911,502 B2* | 3/2018 | Nagai .................... | G11C 16/30 |
| 9,940,274 B2* | 4/2018 | Nakata ................... | G11C 5/148 |
| 2014/0043915 A1* | 2/2014 | Choi ...................... | G11C 16/10 |
| | | | 365/185.25 |
| 2015/0179234 A1* | 6/2015 | Kawase ................. | G11C 5/148 |
| | | | 365/185.08 |
| 2016/0027513 A1* | 1/2016 | Lee ........................ | G11C 16/10 |
| | | | 365/185.02 |

(Continued)

FOREIGN PATENT DOCUMENTS

| | | |
|---|---|---|
| JP | 2010-119262 A | 5/2010 |
| JP | 5319246 62 | 10/2013 |

(Continued)

*Primary Examiner* — Ly D Pham
(74) *Attorney, Agent, or Firm* — Patterson & Sheridan, LLP (57) ABSTRACT

A semiconductor device includes a connector configured for connection to a host, a power circuit supplied with a first voltage from the host via the connector, the power circuit including first and second channels configured to generate second and third voltages, respectively, from the first voltage, a semiconductor memory supplied with the second voltage via the first channel, and a controller for the semiconductor memory, supplied with the third voltage via the second channel. When the first voltage is less than a first threshold, the power circuit turns off the first channel and the second channel.

20 Claims, 6 Drawing Sheets

(56) References Cited

U.S. PATENT DOCUMENTS

2018/0046390 A1    2/2018  Matsumoto et al.
2018/0137925 A1*   5/2018  Nam .................. G11C 16/3431

FOREIGN PATENT DOCUMENTS

| JP | 2015511111 A | 4/2015 |
| JP | 2015515172 A | 5/2015 |

* cited by examiner

SEMICONDUCTOR DEVICE AND CONTROL METHOD THEREOF

CROSS-REFERENCE TO RELATED APPLICATION

This application is based upon and claims the benefit of priority from. Japanese Patent Application No. 2017-065616, filed Mar. 29, 2017, the entire contents of which are incorporated herein by reference.

FIELD

Embodiments described herein relate to generally a semiconductor device and a control method thereof.

BACKGROUND

Semiconductor devices in which power is supplied from hosts, and power circuits including power ICs supply power to controllers, NAND memories, and the like have been developed.

DESCRIPTION OF THE DRAWINGS

FIGS. 1A to 1C are diagrams illustrating an example of the exterior of a semiconductor device according to a first embodiment, wherein

DETAILED DESCRIPTION

In general, according to one embodiment, a semiconductor device includes a connector configured for connection to a host, a power circuit supplied with a first voltage from the host via the connector, the power circuit including first and second channels configured to generate second and third voltages, respectively, from the first voltage, a semiconductor memory supplied with the second voltage via the first channel, and a controller for the semiconductor memory, supplied with the third voltage via the second channel. When the first voltage is less than a first threshold, the power circuit turns off the first channel and the second channel.

Hereinafter, embodiments will be described with reference to the drawings.

In the present specification, some elements are given a plurality of expressions as examples. These expressions are merely examples and so other expressions may be given to the elements. Similarly, other expressions may be given to elements even where a plurality of expressions are not given to such elements.

The drawings are schematic and the relationship between thicknesses and planar dimensions, ratios of the thicknesses of layers, and the like may be different from actual ones. In addition, there may be cases in which the relationships and ratios of dimensions are different between drawings.

First Embodiment

Figure 1A:
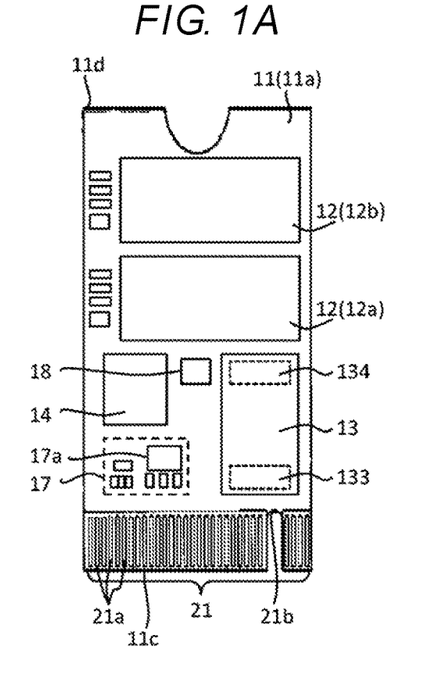
FIG. 1A is a plan view.
Figure 1B:
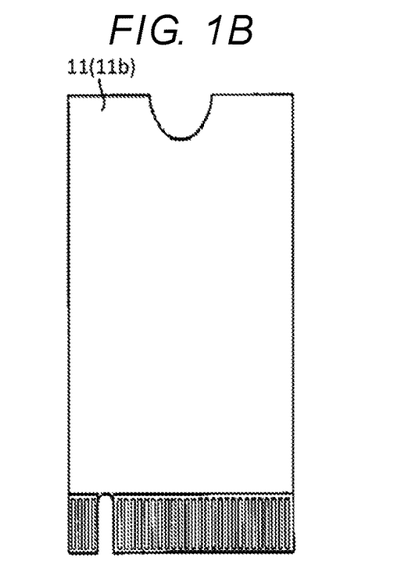
FIG. 1B is a bottom view.
Figure 1C:
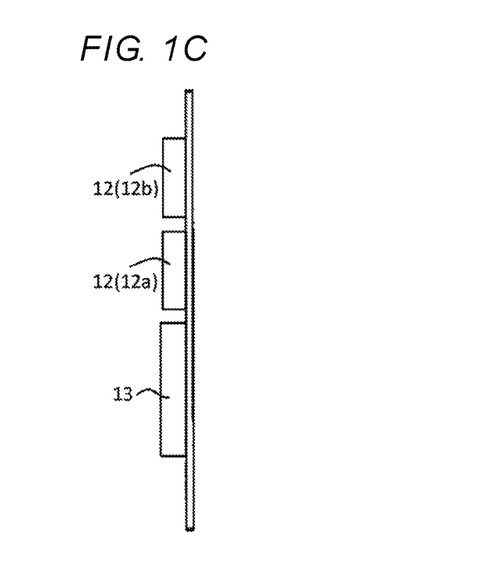
FIG. 1C is a side view.
Figure 2:
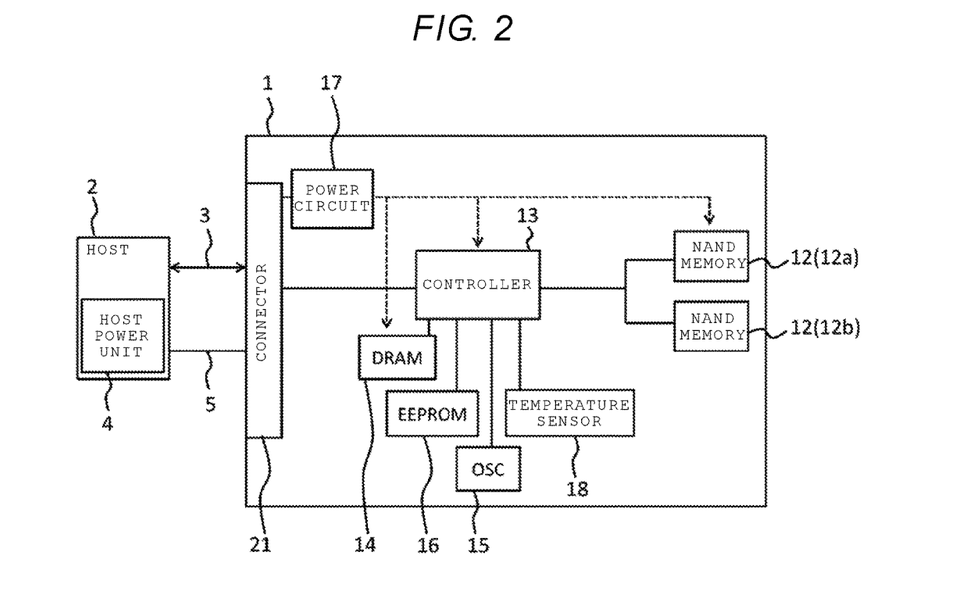
FIG. 2 is a diagram illustrating an example of a system configuration of the semiconductor device according to the first embodiment.

FIGS. 1A to 1C illustrate an example of the exterior of a semiconductor device 1 according to a first embodiment. FIG. 1A is a plan view, FIG. 1B is a bottom view, and FIG. 1C is a side view. FIG. 2 illustrates an example of a system configuration of the semiconductor device 1 according to the first embodiment. The semiconductor device according to the embodiment is, for example, a memory system such as a solid state drive (SSD), but the present disclosure is not limited thereto.

As illustrated in FIG. 2, the semiconductor device 1 is connected to a host 2. In the embodiment, the host 2 is, for example, any of various types of electronic equipment such as a notebook-type portable computer, a tablet terminal, a detachable notebook-type PC, and a mobile phone. The host 2 may be a server device used in a data center or the like. The semiconductor device 1 can be used as, for example, an external memory of the host 2.

As illustrated in FIGS. 1A to 1C and 2, the semiconductor device 1 includes a substrate 11, nonvolatile memories 12, a controller 13, a volatile memory 14 capable of operating at a higher speed than the nonvolatile memories 12, an oscillator (OSC) 15, an electrically erasable and programmable ROM (EEPROM) 16, a power circuit 17, a temperature sensor 18, and other electronic components such as a resistor and a capacitor. In FIGS. 1A to 1C, the oscillator 15 and the EEPROM 16 are not illustrated to simplify the description.

The nonvolatile memory 12 is, for example, an NAND flash memory (hereinafter abbreviated to an NAND memory). In the following description, the nonvolatile memory 12 will be described as an "NAND memory 12," but the nonvolatile memory 12 is not limited thereto. For example, another nonvolatile memory such as a magnetoresistive random access memory (MRAM) may be used.

The volatile memory 14 is, for example, a dynamic random access memory (DRAM). In the following description, the volatile memory 14 will be described as a "DRAM 14," but the volatile memory 14 is not limited thereto. Another volatile memory may be used.

The NAND memory 12 and the controller 13 according to the embodiment are mounted as a semiconductor package which is an electronic component. For example, in the semiconductor package of the NAND memory 12, a plurality of semiconductor chips are stacked to be sealed in one package.

The substrate 11 is, for example, a substantially rectangular circuit board formed of a material such as a glass epoxy resin and defines the external dimensions of the semiconductor device 1. The substrate 11 has a first surface 11a and a second surface 11b located opposite to the first surface 11a. The first surface 11a and the second surface 11b can be called, for example, main surfaces. In the present specification, surfaces other than the first surface 11a and the second surface 11b of the surfaces of the substrate 11 are defined as "side surfaces." In the semiconductor device 1, the first surface 11a is a component-mounted surface on which the NAND memories 12, the controller 13, the DRAM 14, the oscillator 15, the EEPROM 16, the power circuit 17, the temperature sensor 18, and other electronic components such as a resistor and a capacitor are mounted. The second surface 11b is a non-mounted surface on which components such as the NAND memories 12 are not mounted. Since components are not mounted on the second surface, the semiconductor device 1 can be thin, and thus space saving is achieved. Further, it is also possible to miniaturize the host 2 in which the semiconductor device 1 is mounted in some configurations.

In the semiconductor device 1, components such as the NAND memories 12 may also be mounted on the second surface 11b. For example, another function of a test pad or the like for confirming performance of a product may be installed on the second surface 11b.

As illustrated in FIGS. 1A to 1C, the substrate 11 includes a first edge portion 11c and a second edge portion 11d located opposite to the first edge portion 11c. The first edge portion 11c includes a connector 21 (which may be referred to as an interface unit, a substrate interface unit, a terminal unit, or a connection unit). The connector 21 includes, for example, a plurality of connection terminals 21a. The connector 21 is electrically connected to the host 2 and exchange signals (e.g., a control signal and a data signal) with the host 2.

The semiconductor device 1 is electrically connected to the host 2 via the interface 3. The host 2 executes data access control on the semiconductor device 1 and executes writing, reading, and erasing of data on the semiconductor device 1, for example, by transmitting a write request, a read request, and an erasure request to the semiconductor device 1.

The semiconductor device 1 is electrically connected to the host power unit 4 (which is a power circuit) via a power line 5. The host power unit 4 supplies various kinds of power used for the semiconductor device 1 via the power line 5 and the connector 21.

The interface 2 according to the embodiment is, for example, a peripheral component interconnect express (PCIe). That is, a high-speed signal (high-speed differential signal) conforming to the PCIe standard flows between the connector 21 and the host 2.

In the interface 2, another standard such as a Serial Attached SCSI (SAS), a Serial Advanced Technology Attachment (SATA), a Nonvolatile Memory Express (NVMe), or a Universal Serial Bus (USB) may be used.

In the connector 21, a slit 21b is formed at a position deviated from a central position in the transverse direction of the substrate 11 and is fitted to a protrusion or the like formed on the connector side of the host 2. Thus, the semiconductor device 1 can be prevented from being mounted with an incorrect orientation.

The power circuit 17 is electrically connected to the host power unit 4 via the connector 21 and the power line 5. The power circuit 17 supplies necessary power from the host power unit 5 to the semiconductor device 1. The power circuit 17 supplies power to the NAND memory 12, the controller 13, and the DRAM 14. The power circuit 17 is preferably installed near the connector 21 to prevent a loss of the power supplied from the host 2.

The power circuit 17 includes a power IC 17a. Electronic components such as a resistor, a capacitor, and an inductor are connected to the power IC 17a. The power IC 17a will be described below. The power IC 17a is also called a power unit, a power chip, or a composite power control IC. The power IC 17a is, for example, a Power Management Integrated Circuit (PMIC).

The power IC 17a according to the embodiment is, for example, a Wafer Level Chip Size Package (WLCSP) and at least one chip is packaged. The power IC 17a is not limited thereto.

The controller 13 controls an operation of the NAND memories 12. That is, the controller 13 controls writing, reading, and erasing data on and from the NAND memories 12.

The controller 13 includes a reset input and executes initialization (or resetting) of a state of the controller 13 or releasing the reset state in accordance with an input signal to activate the semiconductor device 1 as a system normally. The signal used to release the reset state is called, for example, power on reset. In the description of the present disclosure, when "setting a reset state" is described, resetting the reset state is assumed to also include both setting the state of the controller 13 to the reset state and maintaining the state of the controller 13 to remain in the reset state.

The DRAM 14 is an example, a volatile memory, as described above, and is used to preserve management information of the NAND memory 12 or to cache data. The oscillator 15 supplies an operation signal with a predetermined frequency to the controller 13. The EEPROM 16 stores a control program or the like as fixed information.

The temperature sensor 18 monitors, for example, the temperature of the controller 13. The temperature sensor 18 is mounted near, for example, the controller 13 on the substrate 11, but the position of the temperature sensor 18 is not limited thereto. Further, the temperature sensor 18 may not necessarily be mounted on the substrate 11, but maybe installed as a function of the controller 13.

The temperature sensor 18 measures a surrounding temperature of the position at which the temperature sensor 18 is mounted. A temperature measured by the temperature sensor 18 may be called "a temperature of the semiconductor device 1." When the temperature sensor 18 is mounted near the controller 13, a temperature measured by the temperature sensor 18 may be called "a temperature of the controller 13."

When all the components mounted on the substrate 11 are mounted on only the first surface 11a, as described above, the second surface 11b is a non-component-mounted surface on which components are not mounted. In this case, compared to a case in which substrate-mounted components protruding from a front surface are mounted on both surfaces of the substrate 11, it is possible to thin the semiconductor device 1. Further, it is also possible to miniaturize and thin the host 2 on which the semiconductor device 1 is mounted.

Figure 3:
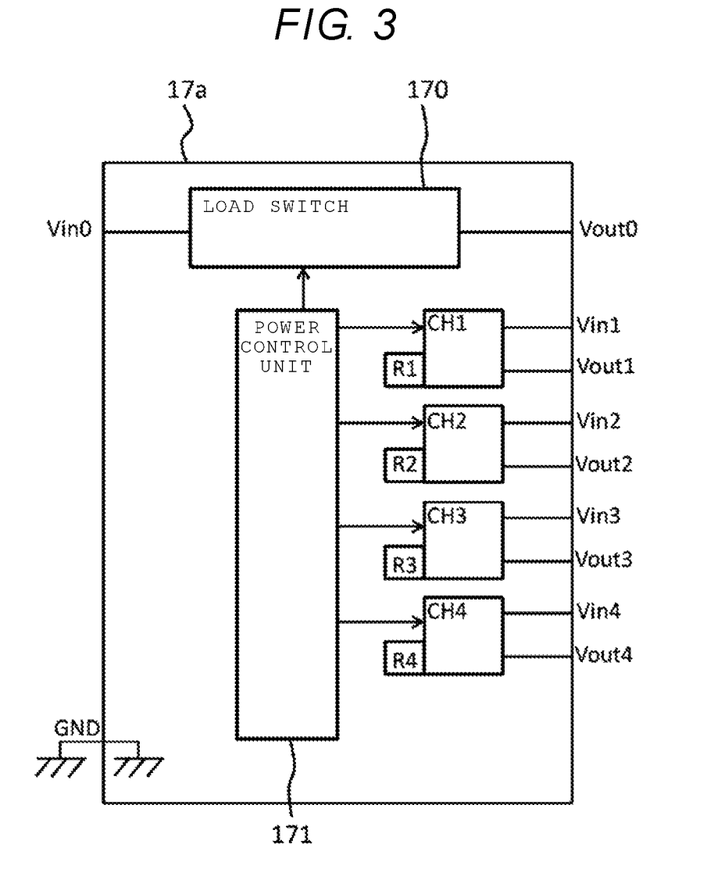
FIG. 3 is a block diagram illustrating a configuration of a power IC according to the first embodiment.

FIG. 3 is a block diagram illustrating a configuration of the power IC 17a according to the embodiment. In the embodiment, the power IC 17a includes a load switch 170, a power control unit 171, and a plurality of power channels CH1 to CH4. The number of power channels is not limited thereto.

An input Vin0 of the load switch 170 is connected to the host 2 (specifically, the host power units 4) via wirings (e.g., wiring layers or internal wirings), the connector 21, and the power line 5 installed in the substrate 11. Power is first supplied from the host power unit 4 to the input Vin0 of the load switch 170.

An output Vout0 of the load switch 170 is electrically connected to inputs Vin1 to Vin4 of the power channels CH via, for example, wirings that are external to the power IC 17a. In other words, power is supplied from the output Vout0 of the load switch 170 to each power channel CH in the power IC 17*a* again via the wirings (e.g., wiring layers or internal wirings) installed in the substrate 11.

On the other hand, when the load switch 170 is switched to Off, the supply of the power to each power channel CH is stopped (i.e., either cut off or interrupted).

In the embodiment, the power channel CH1 is, for example, a low drop out (LDO). The power channels CH2 to CH4 are, for example, DC/DC converters. The power channels CH1 to CH4 include registers R1 to R4, respectively.

The LDO is a linear regulator and is of a circuit type in which an input power is converted into a desired output voltage using an on resistance of a power device (e.g., pass transistor) such as a power metal oxide semiconductor field effect transistor (MOSFET) or a power transistor. The LDO tends to operate as a regulator even when a potential difference between input and output is small.

The DC/DC converter is a switching regulator, outputs a switching pulse by switching an input voltage, and works as a DC power supply by smoothing the output pulse using a filter formed by an inductor and a coil.

In the embodiment, an output Vout2 of the power channel CH2 is connected to the controller 13 and supplies a predetermined voltage to the controller 13. An output Vout3 of the power channel CH3 is connected to the DRAM 14 and supplies the predetermined voltage to the DRAM 14. An output Vout4 of the power channel CH4 is connected to the NAND memories 12 and supplies a predetermined voltage to the NAND memories 12. A type or connection relationship of each power channel CH is not limited to the above-described type or relation, but can be appropriately changed.

The power channels CH1 to CH4 have various protection functions. Examples of the various protection functions include an over voltage protection (OVP) function, an under voltage protection (UVP) function, an over current protection (OCP) function, and the like. Hereinafter, these functions are collectively referred to as protection functions. In the embodiment, a case in which the UVP function mainly works will be described.

In the embodiment, the UVP function is activated when the output voltage of each power channel CH is less than a predetermined value (e.g., less than a UVP threshold, a threshold, or a second/third thresholds). More specifically, for example, when the output voltage Vout of the power channel CH1 is less than a predetermined value Vth, the UVP function of the power channel CH1 is activated. The UVP function is activated, for example, when an input and an output of each power channel CH are short-circuited and an overvoltage is input to the output side.

A result obtained by monitoring whether the above-described UVP function is activated at each power channel CH is stored in each register R provided in each power channel CH. In the embodiment, in a state (initial state) in which the UVP function is not activated, "1" is retained (recorded or set) in each register R. Conversely, "0" is retained (recorded or set) in the register R provided in the power channel CH in which the OVP function is activated. The register R may also be called, for example, a "POWER GOOD (PG) register." Each register R may be configured to monitor each power channel CH continuously or may be configured to monitor each power channel CH periodically (for example, at each period T1). In the embodiment, each register R is assumed to monitor each power channel CH continuously in the description.

In a state in which the UVP function is not activated, "1" may be retained (recorded or set) in the register R. Further, "0" may be retained (recorded or set) in the register R provided in the power channel CH in which the UVP function is activated. Additionally, information recorded in the register is not limited thereto. At least information indicating whether the UVP function is activated in each power channel CH is recorded.

The power control unit 171 is circuit that controls On/Off of the load switch 170. The power control unit 171 monitors each register R of the power channels CH1 to CH4. When values of the monitoring target registers R1 to R4 are changed from "1" to "0," in other words, the UVP function is activated in the power channels CH, the power control unit 171 switches the load switch 170 to Off. When the load switch 170 is switched to Off, the power control unit 171 stops the supply of power to each power channel.

The power control unit 171 may be configured to monitor each register R continuously or may be configured to monitor each register R periodically (for example, at each period T2). In the embodiment, the power control unit 171 is assumed to monitor each register R continuously in the description.

Figure 4:
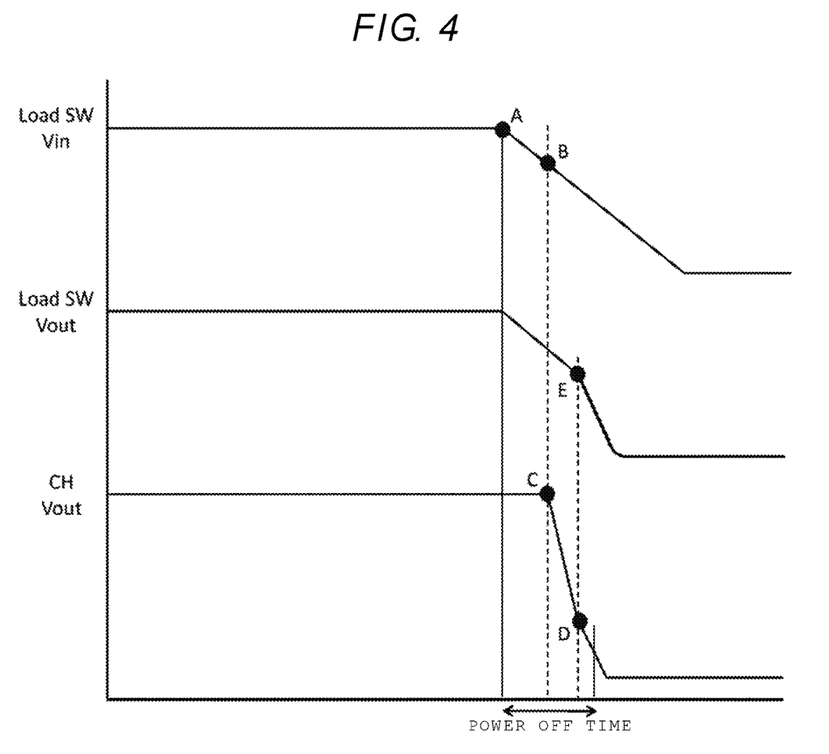
FIG. 4 is a diagram illustrating a sequence at the time of powering off the power IC according to the first embodiment.
Figure 5:
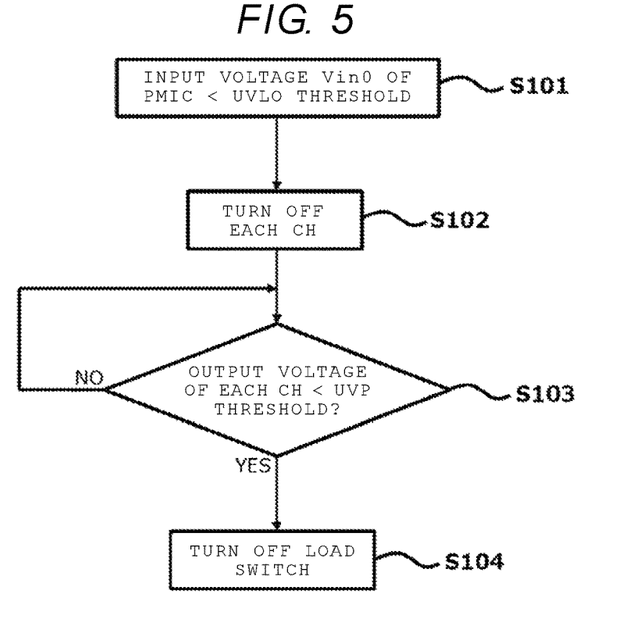
FIG. 5 is a flowchart illustrating an operation at the time of powering off the power IC according to the first embodiment.

Next, an operation of the power IC 17*a* when the semiconductor device 1 according to the embodiment is powered off will be described. FIG. 4 is a diagram illustrating a sequence at the time of powering off the power IC 17*a*. FIG. 5 is a flowchart illustrating an operation at the time of powering off the power IC 17*a*.

As described above, power is supplied from the host 2 to the power circuit 17 (and the power IC 17*a*). When the supply of the power from the host 2 is stopped (a point A in FIG. 4), the value of the input Vin0 of the load switch 170 is lowered. Further, when the input Vin0 of the load switch 170 is less than an under voltage lock out (UVLO) threshold of the power (a point B in FIG. 4: S101 of FIG. 5), the power control unit 171 turns off each power channel CH (a point C in FIG. 4: S102 of FIG. 5).

When each power channel CH is turned off, as illustrated in FIG. 4, the output Vout of each power channel CH is lowered. When the output Vout of each power channel CH is less than the predetermined value (e.g., the UVP threshold or the threshold) (a point D in FIG. 4: YES in S103 of FIG. 5), the power control unit 171 turns off the load switch 170 (a point E in FIG. 4). In other words, when the register R of each channel CH becomes 0, the power control unit 171 turns off the load switch 170. In this case, the UVP threshold is, for example, 0.3 [V] or 0.5 [V], but the present disclosure is not limited thereto.

As described above, according to the embodiment, when the input Vin0 of the load switch 170 is less than the UVLO threshold, the power control unit 171 does not turn off the load switch 170 and turns off only each channel CH. Further, after then the output of each channel CH is less than the UVP threshold and the register R of each channel CH is set to "0," the power control unit 171 is configured to turn off the load switch 170.

Figure 6:
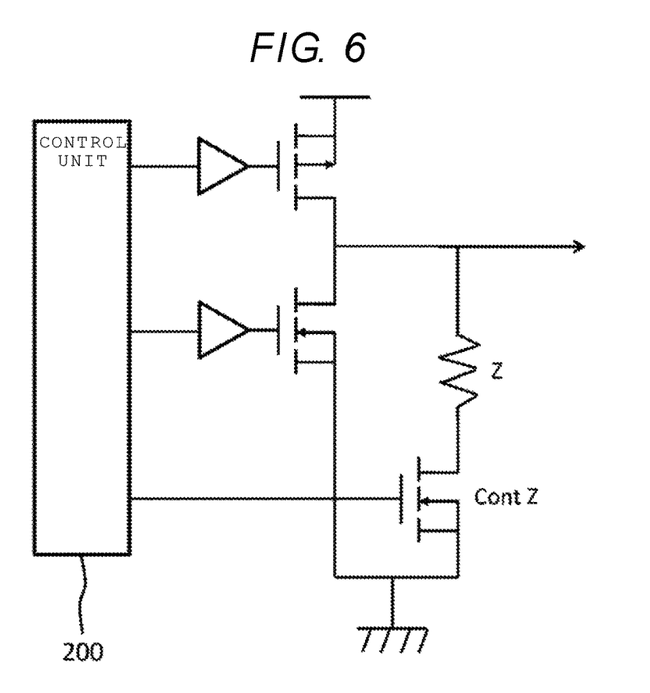
FIG. 6 is a schematic circuit diagram illustrating the components of an output side of power channels according to the first embodiment.

Now, the configurations in which all of the load switch 170 and each channel CH are turned off when the input Vin0 of the load switch 170 is less than the UVLO threshold will be described with reference to FIG. 6. FIG. 6 is a schematic circuit diagram illustrating, for example, the inside of an output side of the power channels CH2 to CH4. As described above, the power channels CH2 to CH4 are, for example, DC-DC converters.

When the input Vin0 of the load switch 170 is less than the UVLO threshold and all of the load switch 170 and each power channel CH are turned off, a discharge resistor Z of the power channel CH enters a conductive state by a discharge resistance control element ContZ, and the voltage of each power channel CH falls. On the other hand, since the output of the load switch 170 also enters the falling state, the input of the power channel CH enters a state of being equal to or less than an operation voltage of the discharge resistance control element ContZ. Thus, the discharge resistor Z is separated from the output of the power channel CH. Therefore, the falling of the voltage of the power channel CH becomes gentle and it may take more time to perform a process of powering off the power IC 17a.

Accordingly, in the embodiment, when the input Vin0 of the load switch 170 is less than the UVLO threshold, the power control unit 171 does not turn off the load switch 170 and turns off only each channel CH. Further, after the output of each channel CH is less than the UVP threshold and the register R of each channel CH is set to "0," the power control unit 171 is configured to turn off the load switch 170. By configuring the load switch 170 to be turned off after each power channel CH is turned off, it is possible to shorten a time in which the power is turned off.

Second Embodiment

Figure 7:
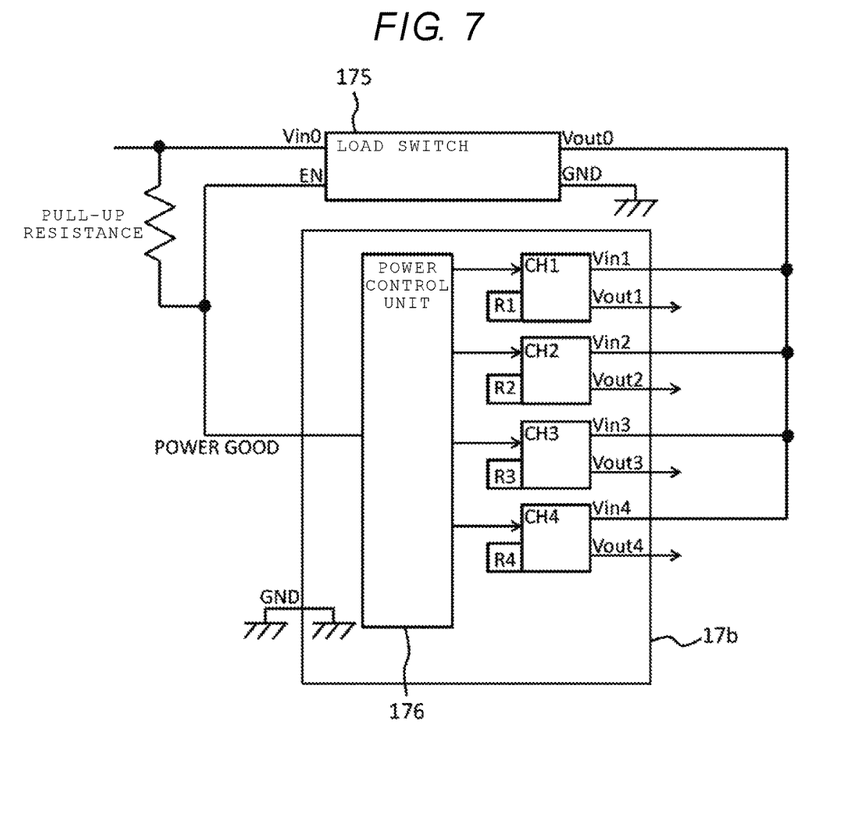
FIG. 7 is a block diagram illustrating a configuration of a power IC and the periphery of the power IC according to a second embodiment.

Next, a second embodiment will be described. The same reference numerals are given to the same configurations as those of the first embodiment and the detailed description thereof will be omitted. FIG. 7 is a block diagram illustrating the configuration of a power IC 17b and the periphery of the power IC 17b according to the embodiment. In the embodiment, a load switch 175 is installed separately from the power IC 17b (i.e., installed outside of the package of the power IC 17b/independently from the power IC 17b) and the output Vout0 of the load switch 175 is connected to the input of each power channel CH of the power IC 17b.

In the embodiment, the power IC 17b includes a "POWER GOOD" output. The "POWER GOOD" output is a signal indicating whether a protection function is activated inside the power IC. Whether the protection function is activated is output by individually distinguishing, for example, "Low" from. "High" or "Low" from "Hi-Z."

The "POWER GOOD" output of the power IC 17b is, for example, an open drain output. More specifically, a field effect transistor (FET) is installed in an output circuit inside the power IC 17b and the drain of the field effect transistor is drawn out the outside of the power IC 17b without being connected inside the power IC 17b.

The "POWER GOOD" output is pull-up on the input side of the load switch 175. More specifically, the "POWER GOOD" output is connected to the input side of the load switch 175 via a pull-up resistance.

An enable (EN) terminal is installed in the load switch 175. For example, when High (H) is input to the EN terminal, the load switch 175 is turned on. When Low (L) is input to the EN terminal, the load switch 175 is turned off.

When the UVP function is activated in the power channels CH1 to CH4 in the embodiment, the "POWER GOOD" signal is output as a low signal and the load switch 175 is turned off. Therefore, by delaying a timing at which the input enters a state of being less than an operation voltage of the discharge resistance control element ContZ illustrated in FIG. 6, it is possible to shorten a time in which the power is turned off.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Various inventions can be embodied by appropriately combining the plurality of constituent elements disclosed in the foregoing embodiments. For example, several constituent elements may be removed from all the constituent elements described in the embodiments. Further, the constituent elements may be appropriately combined in other embodiments.

What is claimed is:

1. A semiconductor device comprising:
a connector configured for connection to a host;
a power circuit supplied with a first voltage from the host via the connector, the power circuit including first and second channels configured to generate second and third voltages, respectively, from the first voltage;
a semiconductor memory supplied with the second voltage via the first channel; and
a controller for the semiconductor memory, supplied with the third voltage via the second channel,
wherein when the first voltage is less than a first threshold, the power circuit turns off the first channel and the second channel.

2. The semiconductor device according to claim 1, wherein the power circuit includes a switch to which the first voltage is supplied and from which the first voltage is supplied to the first and second channels.

3. The semiconductor device according to claim 2, wherein the power circuit turns off the switch when the second voltage is less than a second threshold and the third voltage is less than a third threshold.

4. The semiconductor device according to claim 2, wherein the power circuit further includes a first register that stores a first value indicating whether or not the second voltage is less than the second threshold, and a second register that stores a second value indicating whether or not the third voltage is less than the third threshold.

5. The semiconductor device according to claim 4, wherein the power circuit further includes a control circuit configured to control the first and second channels, and the control circuit is configured to turn off the first and second channels based on the values stored in the first and second registers.

6. The semiconductor device according to claim 5, wherein the control circuit is configured to monitor the first and second registers at periodic intervals.

7. The semiconductor device according to claim 1, wherein the first channel includes a DC-DC converter to generate the second voltage from the first voltage and the second channel includes a DC-DC converter to generate the third voltage from the first voltage.

8. A method of controlling a semiconductor device including a power circuit supplied with a first voltage from a host, the power circuit including first and second channels, a semiconductor memory, and a controller for the semiconductor memory, the method comprising:
generating a second voltage from the first voltage in the first channel;
generating a third voltage from the first voltage in the second channel;
supplying the generated second voltage to the semiconductor memory;

supplying the generated third voltage to the controller; and upon detecting that the first voltage is less than a first threshold, turning off the first and second channels.

9. The method according to claim 8, further comprising:
supplying the first voltage to the first and second channels through a switch.

10. The method according to claim 9, further comprising:
turning off the switch when the generated second voltage is less than a second threshold and the generated third voltage is less than a third threshold.

11. The method according to claim 9, further comprising:
storing a first value indicating whether or not the second voltage is less than the second threshold in a first register; and
storing a second value indicating whether or not the third voltage is less than the third threshold in a second register.

12. The method according to claim 11, wherein the first and second channels are turned off based on the values stored in the first and second registers.

13. The method according to claim 12, further comprising:
monitoring the first and second registers at periodic intervals.

14. The method according to claim 8, wherein the first channel includes a DC-DC converter that generates the second voltage from the first voltage and the second channel includes a DC-DC converter that generates the third voltage from the first voltage.

15. A semiconductor device comprising:
a connector configured for connection to a host;
a switch supplied with a first voltage from the host via the connector;
a power circuit including first and second channels configured to generate second and third voltages, respectively, from the first voltage output by the switch;
a semiconductor memory supplied with the second voltage via the first channel; and
a controller for the semiconductor memory, supplied with the third voltage via the second channel,
wherein when the first voltage is less than a first threshold, the power circuit turns off the first channel and the second channel.

16. The semiconductor device according to claim 15,
wherein the power circuit turns off the switch when the second voltage is less than a second threshold and the third voltage is less than a third threshold.

17. The semiconductor device according to claim 15,
wherein the power circuit further includes a first register that stores a first value indicating whether or not the second voltage is less than the second threshold, and a second register that stores a second value indicating whether or not the third voltage is less than the third threshold.

18. The semiconductor device according to claim 17,
wherein the power circuit further includes a control circuit configured to control the first and second channels, and
the control circuit is configured to turn off the first and second channels based on the values stored in the first and second registers.

19. The semiconductor device according to claim 18,
wherein the control circuit is configured to monitor the first and second registers at periodic intervals.

20. The semiconductor device according to claim 15,
wherein the first channel includes a DC-DC converter to generate the second voltage from the first voltage and the second channel includes a DC-DC converter to generate the third voltage from the first voltage.

* * * * *